United States Patent
Seo et al.

[19]

[11] Patent Number: 5,825,437
[45] Date of Patent: Oct. 20, 1998

[54] STRUCTURE OF A LIQUID CRYSTAL DISPLAY DEVICE AND A METHOD OF MANUFACTURING SAME

[75] Inventors: Hyun Sik Seo, Seoul; In Woo Kim, Kyungki-do, both of Rep. of Korea

[73] Assignee: LG Electronics Inc., Seoul, Rep. of Korea

[21] Appl. No.: 600,529

[22] Filed: Feb. 13, 1996

[30]    Foreign Application Priority Data

Nov. 21, 1995 [KR]   Rep. of Korea ................. 1995 42555

[51] Int. Cl.⁶ .................. G02F 1/136; G02F 1/1343; H01L 29/786
[52] U.S. Cl. ................ 349/46; 349/43; 349/147; 257/771
[58] Field of Search ............... 349/42, 38, 43, 349/46, 139, 138, 147, 148, 187; 257/59, 72, 764, 765, 770, 771; 174/260, 257; 205/171, 199

[56]    References Cited

U.S. PATENT DOCUMENTS

| | | | |
|---|---|---|---|
| 4,556,897 | 12/1985 | Yorikane et al. | 357/71 |
| 5,349,205 | 9/1994 | Kobayashi et al. | 257/59 |
| 5,367,179 | 11/1994 | Mori et al. | 257/59 |
| 5,627,345 | 5/1997 | Yamamoto et al. | 174/265 |

FOREIGN PATENT DOCUMENTS

| | | |
|---|---|---|
| 5-47765 | 2/1993 | Japan . |
| 06-077482 | 3/1994 | Japan . |
| 06-104437 | 4/1994 | Japan . |
| 06-120503 | 4/1994 | Japan . |
| 06-230428 | 8/1994 | Japan . |
| 06-265933 | 9/1994 | Japan . |
| 06-281954 | 10/1994 | Japan . |
| 06-294973 | 10/1994 | Japan . |
| 06-301054 | 10/1994 | Japan . |
| 7-36052 | 2/1995 | Japan . |
| 7-64109 | 3/1995 | Japan . |
| 7-77695 | 3/1995 | Japan . |
| 7-128676 | 5/1995 | Japan . |

OTHER PUBLICATIONS

Patent Abstracts of Japan, Kokai No. 7–294963, Nov. 10, 1995.

*Primary Examiner*—Anita Pellman Gross
*Assistant Examiner*—Tai V. Duong
*Attorney, Agent, or Firm*—Finnegan, Henderson, Farabow, Garrett & Dunner, L.L.P.

[57]    ABSTRACT

A liquid crystal display device comprising a substrate; a first metal layer including an aluminum alloy having a first refractory metal with a first melting temperature over the substrate; and a second metal layer including a pure aluminum or an aluminum alloy having a second refractory metal with a second melting temperature lower than the first melting temperature over the first metal layer. The above liquid crystal display device of the present invention prevents the occurrence of hillocks on the aluminum gate metal. A method of manufacturing a liquid crystal display device is disclosed including the steps of forming a first metal layer of an aluminum alloy including a refractory metal having a first melting temperature on a substrate; and forming a second metal layer of a pure aluminum or an aluminum alloy including a refractory metal having a second melting temperature lower than the first melting temperature on the first metal layer.

40 Claims, 11 Drawing Sheets

STRUCTURE OF A LIQUID CRYSTAL DISPLAY DEVICE AND A METHOD OF MANUFACTURING SAME

BACKGROUND OF THE INVENTION

A. Field of the Invention

The present invention relates to a liquid crystal display device, and more particularly, to a liquid crystal display device in which the generation of hillocks is controlled.

B. Description of the related art

Thin film transistors (TFT) have been widely used as a switching device for switching, in response to an image signal, picture elements (pixel) in an active matrix liquid crystal display device. This so called "TFT-LCD" is composed of a bottom plate on which thin film transistors and corresponding pixel electrodes are formed, a top plate having color filters for corresponding pixel electrodes and a common electrode, and liquid crystal filled between the top and bottom plates.

In the thin film transistor (TFT) of the above TFT-LCD, to reduce a line delay, an aluminum metal film having a low resistivity is used for a gate electrode, a gate line, source/drain electrodes, a pad and the like. However, this type of TFTs have a problem in that hillocks are generated on the surface of the aluminum metal film due to a compressive stress generated between the aluminum metal and an insulating substrate on which the aluminum metal is formed.

The compressive stress is generated because the insulating substrate is bent due to the difference in the coefficients of thermal expansion between the insulating substrate and the aluminum metal during the subsequent high temperature process (e.g., deposition of a gate insulating film by plasma enhancement chemical vapor disposition "PECVD" and the like). More specifically, since the coefficient of thermal expansion of aluminum Al (about $20 \times 10^{-6}/°C$.) is greater than that of glass (about $4 \times 10^{-6}/°C$.) which constitutes the insulating substrate, the glass substrate inhibits the expansion of the aluminum metal film during the high temperature process, causing the substrate to bend or bulge.

When such a compressive stress is applied to the aluminum metal film, aluminum atoms in the Al metal film tend to diffuse from the place where the stress is high to the place where the stress is low. Then, the aluminum atoms rise to the surface of the aluminum metal film to relieve the compressive stress, thereby generating the hillock.

Since the film which is deposited on the aluminum metal film in the subsequent process may not go over the sudden rise (or step) of the hillock, the metal line is shorted due to enchant in the subsequent etching process, deteriorating the process yield. To solve the above problem, various approaches have been proposed. For example, FIG. 1 is a plan view of a signal line of a conventional liquid crystal display device. The signal line is composed of a gate line 1 arranged on a substrate, a gate electrode 2 connected to gate line 1 (i.e., composed of 2a and in a vertical direction, and a pad 3 (i.e., composed of 2c connected to gate line 1 in a horizontal direction.

FIG. 2 is a cross-sectional view of the liquid crystal display of FIG. 1, taken along lines A–A', B–B', and C–C'. The cross-section taken along line A–A' is that of the gate electrode. The cross-section taken along line B–B' is that of the gate line. The cross-section taken along line C–C' is that of the pad. An Al metal line 2a, 2b, 2c of a single film structure is formed on an insulating substrate 1. An anodic oxide film 3 is formed on the surface of each of Al metal lines 2a and 2b (i.e., gate lines 2a and 2b), and on Al metal line 2c (i.e, pad part 2c) except for an open portion thereof.

Further, a refractory metal 4 is formed on the portion of Al metal line 2c which is not covered by anodic oxide film 3. A gate insulating film 5 is formed on the entire surface of insulating film 1 on which each Al metal line 2a, 2b, 2c is formed except for the portion of Al metal line 2c on which the refractory metal is formed.

FIGS. 3a, 3b, 3c and 3d are cross-sectional views for illustrating a conventional method of manufacturing the liquid crystal display of FIG. 1, taken along lines A–A', B–B', and C–C'. The cross-section taken along the line A–A' is that of the gate electrode. The cross-section taken along line B–B' is that of the gate line. The cross-section taken along line C–C' is that of the pad. Referring to FIG. 3a, an Al metal is deposited on an insulating substrate 1. The Al metal is selectively removed photo-lithographically to form a gate electrode 2a, a gate line 2b, and a pad 2c constituting Al metal lines.

Referring to FIG. 3b, a photoresist (PR) film (not shown) is formed on the entire surface of insulating substrate 1 on which Al metal line 2a, 2b, 2c is formed. Then, the PR film is patterned so as to be left only on Al metal line 2c of the pad. Using the patterned PR film as a mask, through anodic oxidation, an anodic oxide film 3 of $Al_2O_3$ is formed on the surface of Al metal lines 2a and 2b of the gate electrode and gate line, respectively, and on Al metal line 2c of the pad except for the part of the pad on which the PR is left (i.e., open portion of Al metal line 2c of the pad). The anodic oxidize film is not formed on the open portion of Al metal line 2c of the pad, to maintain the current flow in the electrode part performing TAB when the LCD is operated.

Referring to FIG. 3c, after removing the PR pattern, a refractory metal is deposited on the entire surface of insulating substrate 1 on which the Al metal line is formed. The refractory metal is photo-lithographically removed selectively to form a refractory metal film 4 only on the open portion of Al metal line 2c where the pad is exposed. The refractory metal is left only on the open portion of the pad to suppress the hillock generated on the surface of the Al metal during the subsequent high temperature process (e.g., deposition of a gate insulating film by PECVD and the like).

Since no anodic oxide film is formed on the open portion of the pad, the hillock is generated on the surface of the Al metal of the pad during the subsequent high temperature process. This causes the metal line to be shorted due to enchant in the subsequent process, thereby deteriorating the yield. Since the refractory metal is left on the open portion of the pad, the hillock is suppressed due to the mechanical force applied from refractory metal film 4.

Referring to FIG. 3d, an insulating film is formed on the entire surface. Then, a PR film is formed on the entire surface except for refractory metal film 4 of the open portion of the pad. Using the PR film patterned as such as a mask, a gate insulating film 5 of the pad is removed. Then, the patterned photoresist film is removed, thereby forming a pad's open metal line 2c without gate insulating film 5 thereover.

In the above approach, an Al metal having a low resistivity is used as the signal line to minimize the line delay, but the hillock generated during the high temperature process is not suppressed by the anodic oxide film formed on the Al metal. Due to the generation of the hillock, the metal line is shorted by the enchant in the subsequent process, thereby deteriorating the yield.

In an alternative approach for suppressing the generation of the hillock on the aluminum metal, the gate electrode is formed in a single film structure of an aluminum alloy. In such an aluminum alloy, an impurity metal such as Ta, Si and Cu is added to an aluminum site in several atomic percents to suppress the diffusion of the aluminum, thereby inhibiting the generation of the hillock. However, this approach has a drawback in that it tends to increase the line resistivity, thus making it inapplicable to large area and/or and high definition TFT LCDs.

For example, FIG. 4 is a cross-sectional view for illustrating another conventional method for making the liquid crystal display (shown in Japanese Laid-Open patent application 6-104437), taken along lines A–A', B–B', and C–C' in FIG. 1. The cross-section taken along line A–A' is that of the gate electrode. The cross-section taken along line B–B' is that of the gate line. The cross-section taken along line C–C' is that of the pad.

Referring to FIG. 4, each Al/AlTa metal line 2a, 2b, 2c is formed on an insulating substrate 1, and composed of an Al metal film and an AlTa metal film stacked on the Al metal film. An anodic oxide film 3 is formed on the surface of Al/AlTa metal lines 2a (i,e., gate electrode) and 2b (i.e., gate line) and on the sidewalls of Al/AlTa metal line 2c of the pad. A gate insulating film 4 is formed over the entire surface of insulating substrate 1 on which Al/AlTa metal line 2a, 2b, 2c is formed except for the open portion of Al/AlTa metal line 2c of the pad. A refractory metal 5 is formed on the open portion of Al/AlTa metal line 2c of the pad and on a portion of gate insulating film 4.

FIGS. 5a through 5e are cross-sectional views for illustrating yet another conventional method of manufacturing the liquid crystal display taken along lines A–A', B–B', and C–C'. The cross-section taken along line A–A' is that of the gate electrode. The cross-section taken along line B–B' is that of the gate line. The cross-section taken along line C–C' is that of the pad.

Referring to FIG. 5a, an Al metal is deposited on an insulating substrate 1. An AlTa metal of an Al alloy having a refractory metal added to AlTa is deposited on the Al metal. The combined Al metal and AlTa metal film structure is selectively removed photo-lithographically, to form a Al/AlTa metal line 2 of a double film structure in which the AlTa film is stacked on the Al film.

Referring to FIG. 5b, a photoresist film 6 is formed on the entire surface of insulating substrate 1 on which each Al/AlTa metal line 2a, 2b, 2c is formed. Then, photoresist film 6 is patterned so as to be left only on the top portion of Al/AlTa metal line 2c of the pad.

Referring to FIG. 5c, using the patterned photoresist film as a mask, through anodic oxidation, an anodic oxide film 3 is formed on the surface of Al/AlTa metal line 2a, 2b of the gate electrode and gate line, respectively, and only on the sidewalls of Al/AlTa metal line 2c so as to expose the pad for electrical connection to the outside. An anodic oxide film, $Al_2O_3$ is formed on the sidewalls of the Al metal film of Al/AlTa metal line 2a, 2b, 2c, and AlTaOx is formed on the surface of the AlTa metal film of Al/AlTa metal line 2a, 2b, and of the sidewalls of metal line 2c.

Referring to FIG. 5d, a gate insulating film 4 is deposited on the entire surface of insulating substrate 1 on which Al/AlTa metal line 2a, 2b, 2c is formed. A gate insulating film 4 is removed photo-lithographically only from the top portion of Al/AlTa metal line 2c of the pad.

Referring to FIG. 5e, a refractory metal is deposited on the entire surface of gate insulating film 4, and Al/AlTa metal line 2c in which the pad portion is exposed. The refractory metal is selectively removed photo-litho-graphically, to form a refractory metal film 5 so as to be left only on the open portion of Al/AlTa metal line 2c. In the open portion of the pad where no anodic oxide film is formed, the generation of the hillock is inhibited only by the mechanical force applied thereto by the AlTa film during the subsequent high temperature process (e.g., deposition of the gate insulating film by PECVD or CVD). To enhance such inhibition, refractory metals such as Cr, Mo and Ta are additionally deposited to cover the open portion of the pad.

According to the above approach, where a pure Al is used for the gate electrode, and an Al alloy having a refractory metal added to the Al metal is formed on the top of the Al electrode, the anodic oxide film and/or aluminum alloy (AlTa) over the Al electrode suppresses the hillock generated on the surface of the Al electrode during the subsequent high temperature process, due to the mechanical force applied to the Al electrode. However, the above approach has several drawbacks.

For example, the structure of the glass substrate/Al film/ AlTa film stacked in that order does not suppress the Al diffusion caused by the compressive stress generated between the glass substrate and the Al film during the high temperature process. Therefore, when the mechanical force applied to the Al metal by the layers formed over the Al metal is not sufficient and/or no anodic oxidate film is formed over the Al metal, the generation of the hillock cannot be controlled sufficiently only by the mechanical force of the AlTa. It can reduce the number of hillocks, but large size hillocks still appear.

Further, to suppress the generation of the large size hillock, the Al alloy deposited on the Al metal is designed to have a thickness (i.e., about 2~3000 Å) greater than that of the Al metal (i.e., about 1000 Å). However, the deposition of thicker Al alloy having a higher resistivity on the Al metal increases the overall line delay. Furthermore, since the Al alloy (AlTa) has a high resistivity, it is not suitable for AM-LCDs with a large picture size, high aperture ratio or high resolution.

SUMMARY OF THE INVENTION

In order to solve the aforementioned problems, it is an object of the present invention to provide the structure of a liquid crystal display device and a method of manufacturing same, in which a process is simplified and a buffer layer is formed between a glass substrate and an Al metal film, thereby preventing the hillock.

To accomplish the object of the present invention, a liquid crystal display device, as embodied and broadly defined herein, includes a substrate; a first metal layer including an aluminum alloy having a first metal with a first melting temperature formed over the substrate; and a second metal layer including a pure aluminum or an aluminum alloy having a second metal with a second melting temperature lower than the first melting temperature formed over the first metal layer.

To accomplish the object of the present invention, a method of making a liquid crystal display device, as embodied herein, includes forming a first metal layer including an aluminum alloy having a first metal with a first melting temperature over a substrate; and forming a second metal layer including a pure aluminum or an aluminum alloy having a second metal with a second melting temperature lower than the first melting temperature over the first metal layer.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE ATTACHED DRAWINGS

DESCRIPTION OF THE PREFERRED EMBODIMENT

Reference will now be made in detail to the present preferred embodiments of the invention, examples of which are illustrated in the accompanying drawings.

Figure 1:
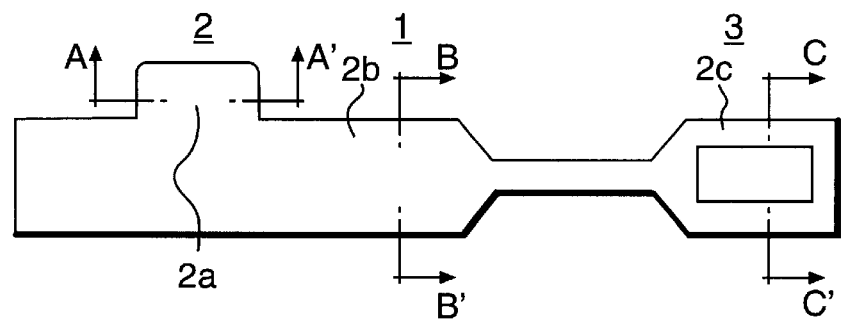
FIG. 1 is a plan view of a signal line of a conventional liquid crystal display device.
Figure 2:
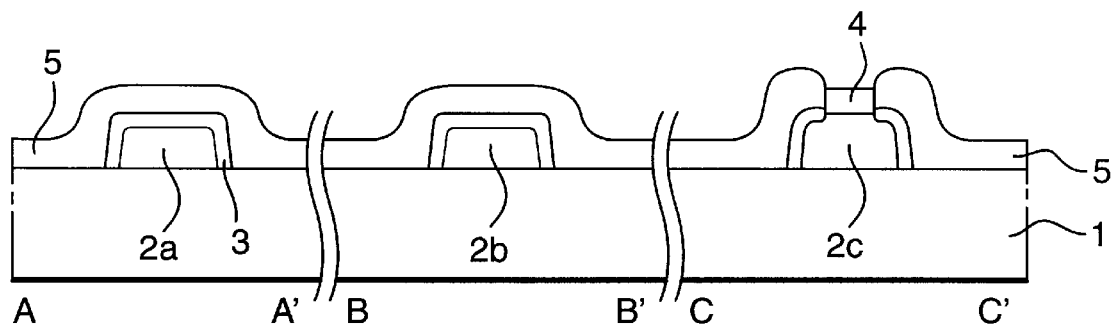
FIG. 2 is a cross-sectional view of the liquid crystal display of FIG. 1, taken along lines A–A', B–B', and C–C'.
Figure 3A:
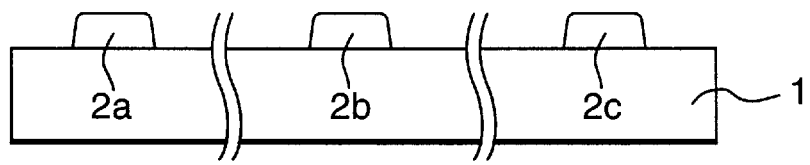
FIGS. 3a, 3b, 3c and 3d are various cross-sectional views for illustrating a conventional method of manufacturing the liquid crystal display of FIG. 1, taken along lines A–A', B–B', and C–C'.
Figure 3B:
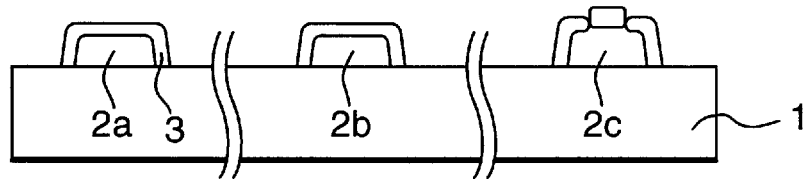
Figure 3C:
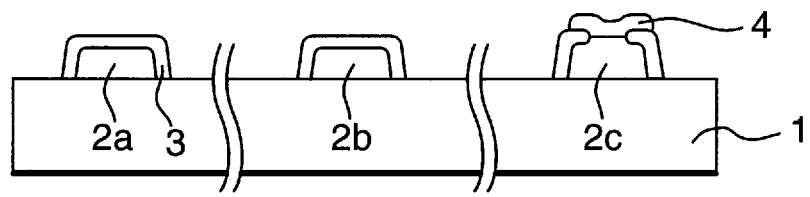
Figure 3D:
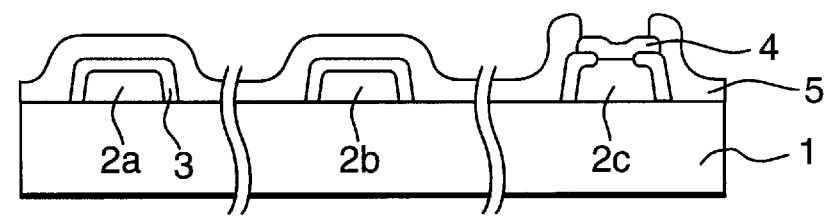
Figure 4:
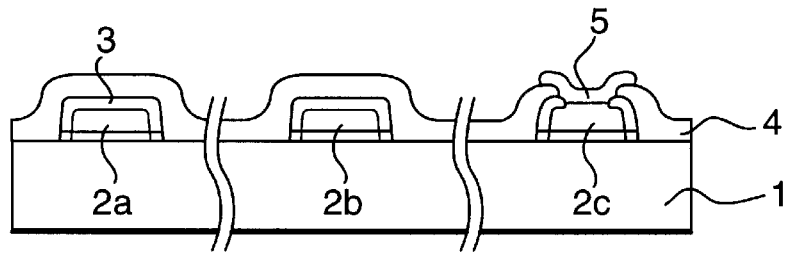
FIG. 4 is a cross-sectional view for illustrating another conventional method of manufacturing the liquid crystal display of FIG. 1, taken along the lines A–A', B–B', and C–C'.
Figure 5A:
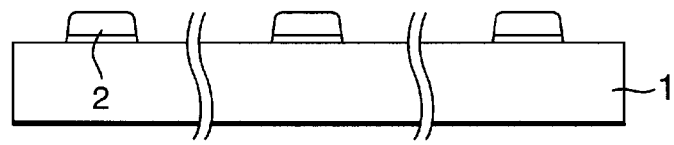
FIGS. 5a, 5b, 5c, 5d and 5e are various cross-sectional views for illustrating another conventional method of manufacturing the liquid crystal display of FIG. 1, taken along lines A–A', B–B', and C–C'.
Figure 5B:
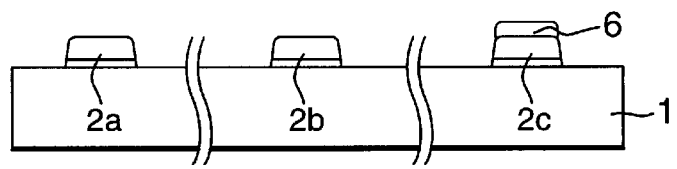
Figure 5C:
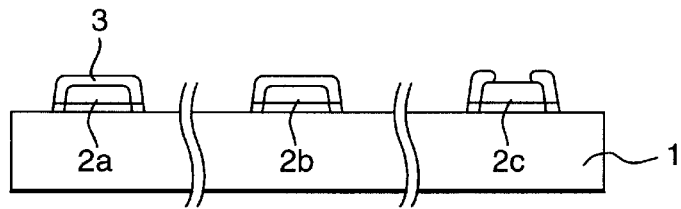
Figure 5D:
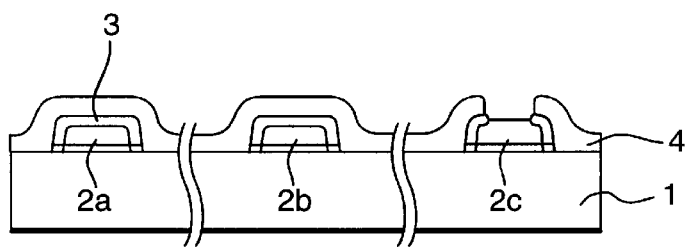
Figure 5E:
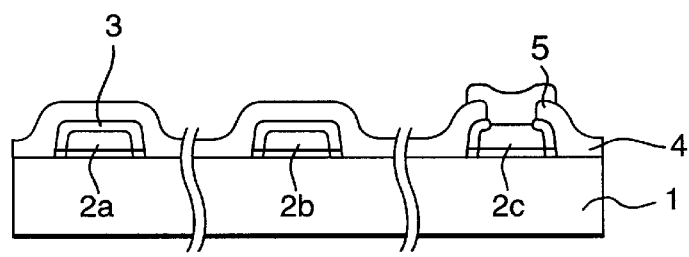
Figure 6:
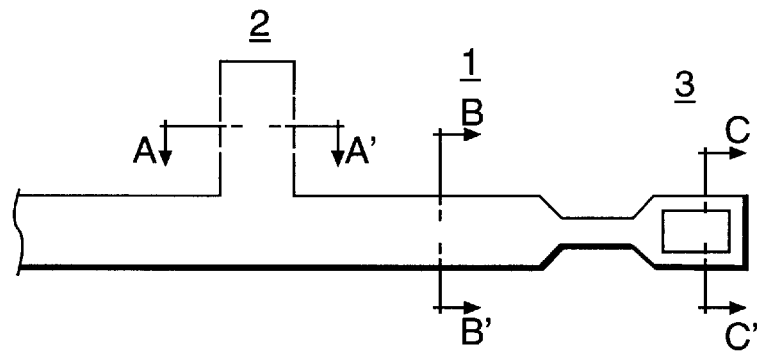
FIG. 6 is a plan view of a liquid crystal display device according to an embodiment of the present invention.

FIG. 6 is a plan view of a liquid crystal display device according to an embodiment of the present invention. A gate line 1 is arranged. A gate electrode 2 is formed so as to be connected with gate line 1 substantially perpendicular to gate line 1. A data line 3 is formed in the direction crossing gate line 1 perpendicularly.

Figure 7A:
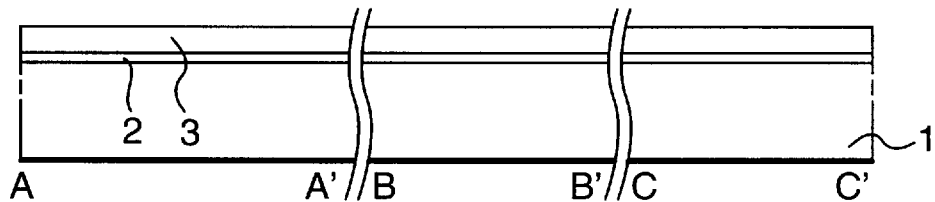
FIGS. 7a, 7b and 7c are various cross-sectional views for illustrating a method of manufacturing the liquid crystal display of FIG. 6 according to an embodiment of the present invention, taken along lines A–A', B–B', and C–C'.
Figure 7B:
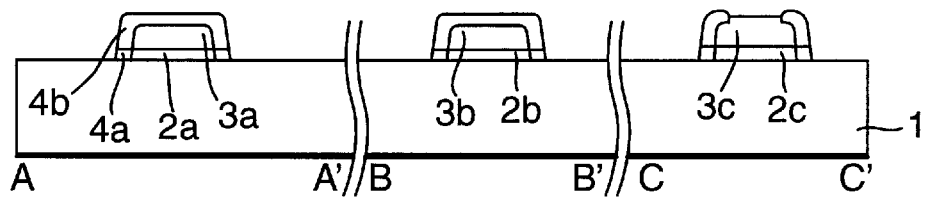
Figure 7C:
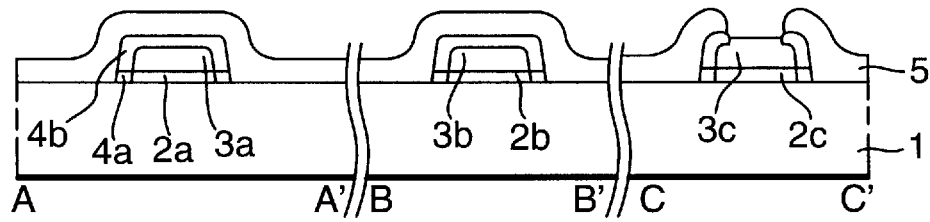

FIGS. 7a through 7c are various cross-sectional views for illustrating a method for making the liquid crystal display of FIG. 6 according to an embodiment of the present invention, taken along lines A–A', B–B', and C–C'. The cross-section taken along line A–A' is that of the thin film transistor including gate electrode 2. The cross-section taken along line B–B' is that of the gate line. The cross-section taken along line C–C' is that of the pad representing data line 3.

In the structure of the liquid crystal display device of the present invention, referring to FIGS. 7b and 7c, each first metal layer 2a, 2b, 2c is formed on a substrate 1 and preferably composed of an aluminum alloy. In the Al alloy, an impurity is added to an aluminum site including a refractory metal having a first melting temperature. On each first metal layer 2a, 2b, 2c, a corresponding second metal layer 3a, 3b, 3c, respectively, is formed. Each second metal layer 3a, 3b, 3c is preferably composed of a pure aluminum, or an aluminum alloy preferably having a refractory metal with a second melting temperature lower than the first melting temperature.

Further, a first anodic oxide film 4a is formed on the sidewalls of each first metal layer 2a, 2b, 2c; and a second anodic oxide film 4b is formed on the surface of each second metal layer 3a, 3b, and also on the surface of second metal layer 3c except for an open portion of second metal layer 3c of the pad. A first insulating film 5 is formed on the entire surface of insulating substrate 1 and the entire surface of first and second metal layers 2a~2c and 3a~3c except for the open portion of second metal layer 3c of the pad.

A preferred manufacturing method of the above structure will be described hereinafter. Referring to FIG. 7a, each first metal layer 2a, 2b, 2c, which is formed on an insulating substrate 1, as embodied herein, is preferably composed of an aluminum alloy. The Al alloy preferably includes, by about 0.1~2 atomic %, a refractory metal having a melting temperature greater than about 1500° C. Subsequently, a second metal layer 3a, 3b, 3c having a pure aluminum, or an Al alloy having a refractory metal with a melting temperature less than about 1500° C., which is added to Al by about 0.1~2 atomic %, is formed on first metal layer 2a, 2b, 2c, respectively. Each second metal layer 3a, 3b, 3c is preferably stacked on first metal layer 2a, 2b, 2c, respectively.

The above refractory metal of first metal layer 2a, 2b, 2c preferably includes one or more of tantalum (Ta), titanium (Ti), molybdenum (Mo), tungsten (W), niobium (Nb), zirconium (Zr), and vanadium (V). The above refractory metal of second metal layer 3a, 3b, 3c preferably includes one or more of silicon and copper. In the structure of the present invention as described above, during the subsequent high temperature process, although no anodic oxide film is formed over the first/second metal layers, no hillock is generated on the surface of the second metal layer.

Referring to FIG. 7b, first metal layer 2a, 2b, 2c and second metal layer 3a, 3b, 3c are selectively removed photolithographically at the same time using a common mask, thereby patterning concurrently the first/second metals layers stacked on top of another constituting a double film structure. In other words, an island composed of the second metal film layer stacked on the first metal layer is concurrently produced.

During the subsequent high temperature process (e.g., deposition of an insulating film $SiO_2$, SiNx by PECVD or CVD), although no anodic oxide film is formed over the first/second metal layers, no hillock is generated on the metal layer.

Referring to FIG. 7b, a photoresist film is patterned so as to be left only on the open pad portion of second metal layer 3c on line C–C'. Through anodic oxidation process, first anodic oxide film 4a is formed on the sidewalls of each first metal layer 2a, 2b, 2c, and second anodic oxide film 4b is formed on the entire surface of each of second metal layers 3a and 3b, and second metal layer 3c except for the open portion of second metal layer 3c on line C–C'. Each of first and second anodic oxide films 4a and 4b, as embodied herein, preferably has an angle which is not zero with respect to the lateral direction of substrate.

Referring to FIG. 7 c, a first insulating film 5 (preferably $SiO_2$, SiNx) is formed over the entire surface of insulating substrate 1 and first and second metal layers 2a~2c and 3a~3c. Then, first insulating film 5 is photolithographically removed selectively, thereby exposing the open portion of second metal layer 3c of the pad on line C–C'.

FIGS. 8a~8e show cross-sectional views for illustrating another method of manufacturing the display of FIG. 6 according to an embodiment of the present invention, taken lines A–A', B–B', and C–C'. The cross-section taken along line A–A' is that of the thin film transistor. The cross-section taken along line B–B' is that of the gate line. The cross-section taken along line C–C' is that of the pad.

Figure 8A:
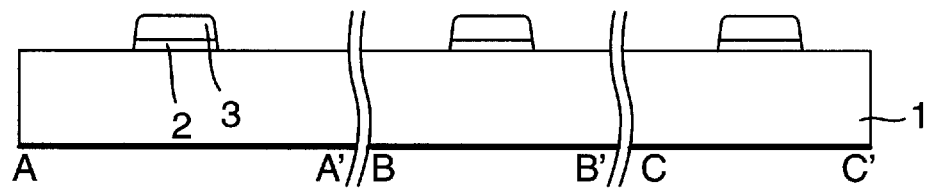
FIG. 8a, 8b, 8c, 8d and 8e are various cross-sectional views for illustrating another method of manufacturing the liquid crystal display of FIG. 6 according to an embodiment of the present invention, taken along lines A–A', B–B', and C–C'.

Referring to FIG. 8a, a first metal layer 2a, 2b, 2c is formed on an insulating substrate 1 and preferably composed of an aluminum alloy. The Al alloy preferably has a refractory metal with a melting temperature greater than about 1500° C. added to the Al by about 0.1~2 atomic %. Then, a second metal layer 3a, 3b, 3c is formed on first metal layer 2a, 2b, 2c, respectively. Each second metal layer 3a, 3b, 3c preferably includes a pure aluminum or an Al alloy having a refractory metal with a melting temperature less than about 1500° C. added to the Al by about 0.1~2 atomic %.

The above refractory metal of first metal layer 2a, 2b, 2c preferably includes one or more of tantalum (Ta), titanium (Ti), molybdenum (Mo), tungsten (W), niobium (Nb), zirconium (Zr), and vanadium (V). The above refractory metal of second metal layer preferably includes one or more of silicon copper. Then, first metal layer 2a, 2b, 2c and corresponding second metal layer 3a, 3b, 3c are photo-lithographically removed selectively at the same time using a common mask, thereby forming a stacked metal line having a double film structure.

Figure 8B:
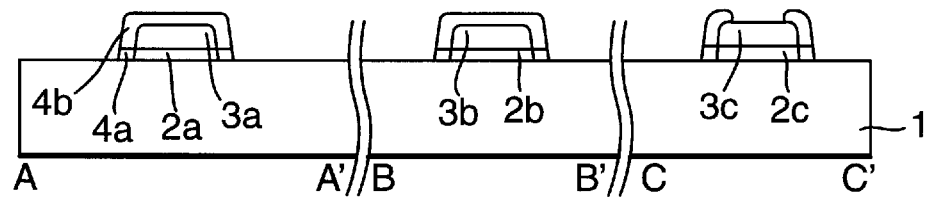

Referring to FIG. 8b, a photoresist film (not shown) is formed on the entire surface of the resultant structure and patterned so as to be left only on the open pad portion of second metal layer 3c on line C–C' (pad open region). Then, through anodic oxidation, a first anodic oxide film 4a is formed on the sidewalls of each first metal layer 2a, 2b and 2c, and a second anodic oxide film 4b is formed on the entire surface of each second metal layer 3a, 3b on lines A–A' and B–B', and second metal layer 3c on line C–C' except for the open pad portion thereof.

Each of first and second anodic oxide films 4a and 4b preferably has an angle which is not zero with respect to the lateral direction of substrate 1. Then, a first insulating film 5 (preferably $SiO_2$ or SiNx formed by PECVD or CVD) is formed on the entire surface of insulating substrate 1. In this structure, even where first insulating film 5 is not formed over anodic oxide film 4a, 4c, no hillock is generated.

Figure 8C:
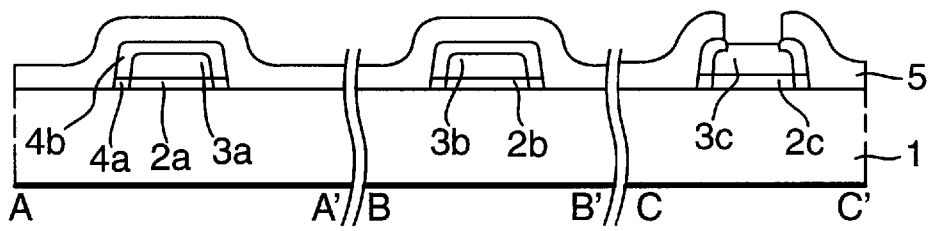

Referring to FIG. 8c, first insulating film 5 is photo-lithographically removed selectively, so as to expose the open pad portion of second metal layer 3c on line C–C'.

Figure 8D:
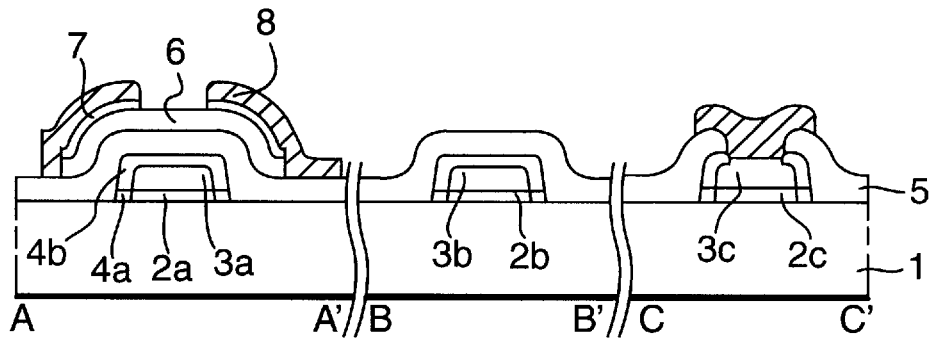

Referring to FIG. 8d, after sequentially depositing a semiconductor layer and a doped semiconductor layer on first insulating film 5, a patterned semiconductor layer 6 and a patterned doped semiconductor layer 7 are photo-lithographically patterned on first insulating film 5 on line A–A'. Then, a metal layer is deposited on the entire surface of the resultant structure and patterned photo-lithographically to form a third metal layer 8 of the source/drain electrodes on doped semiconductor layer 7 and second metal layer 3c on line C–C'.

Figure 8E:
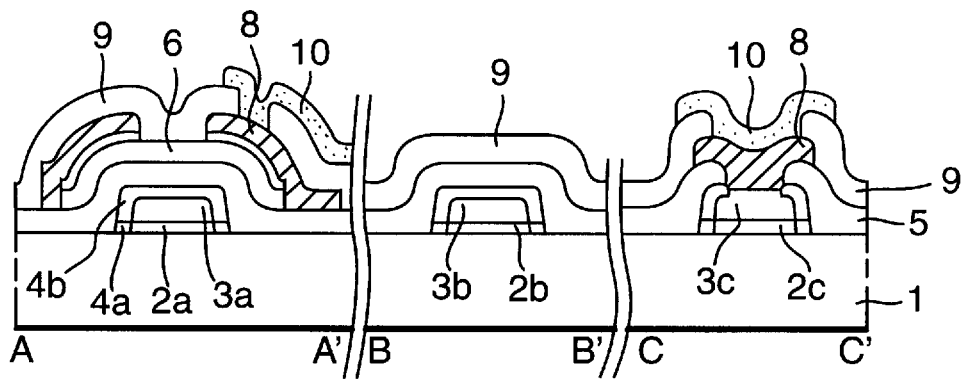

Referring to FIG. 8e, a second insulating film 9 is formed on the entire surface of third metal layer 8 and first insulating film 5 and removed photo-lithographically to form a contact hole selectively on the drain region of third metal layer 8 and to expose a portion of third metal layer 8 on line C–C'. Then, a transparent conductive film is deposited on the entire surface of the resultant structure and patterned photolithographically to form a pixel electrode and a transparent electrode 10. The pixel electrode is so formed to be connected through the contact hole formed on the drain electrode on line A–A', and transparent electrode 10 is so formed on a portion of second insulating film 9 and on third metal layer 8 on line C–C'.

In the structure where the glass substrate, AlTa and Al are stacked in this order, the Al diffusion caused by the compressive stress generated due to the difference in the coefficients of thermal expansion between glass/AlTa/Al is suppressed by Ta. Thus, no hillock is generated.

Further, since the Al film formed on the AlTa film has the same coefficient of thermal expansion (and material characteristics) as that of the AlTa, the compressive stress is not generated in the interface between the AlTa and Al films during the subsequent high temperature process. Since the compressive stress which exists between the glass substrate and the Al film is relieved by the AlTa (buffer) layer intermediate the glass substrate and the Al film, no hillock on the Al film is generated.

Figure 9:
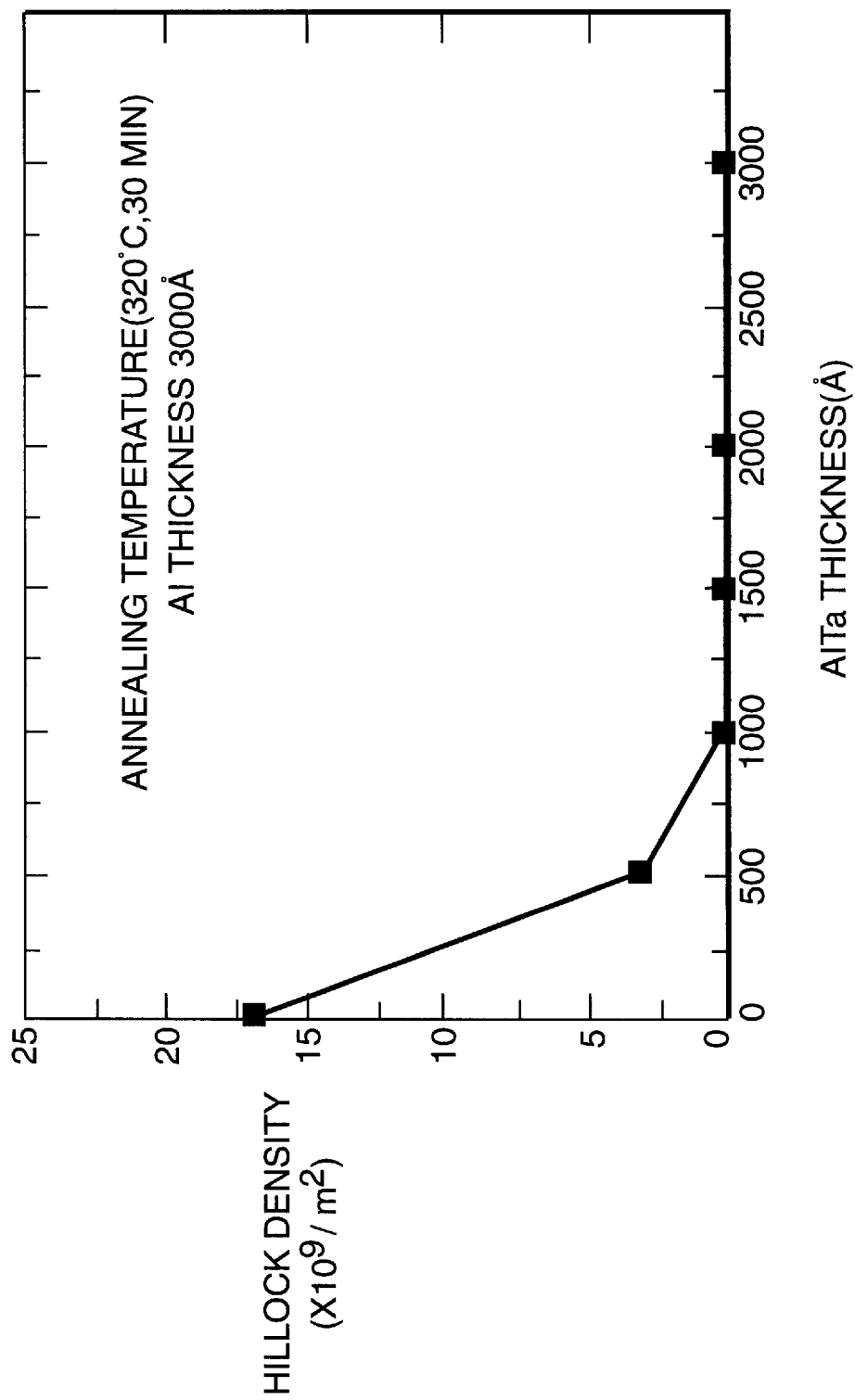
FIG. 9 is a graph showing the density variation of the hillock formation versus the thickness of the AlTa buffer layer.

Therefore, according to the present invention, no hillock is generated on the Al film, regardless of whether the mechanical force (by anodic oxide film and/or refractory metal) is applied to the Al film or not. This feature of the invention has been demonstrated through experiments, explained below. FIG. 9 is a graph showing the density variation of the hillock versus the thickness of the AlTa buffer layer. The annealing is performed for about 30 minutes at the temperature of about 320° C. The thickness of the Al on the AlTa buffer layer is about 3000Å.

Referring to FIG. 9, when the AlTa buffer layer is not used (i.e., AlTa thickness is zero in FIG. 9), the hillock is generated to a density of about $17 \times 10^9/m^2$. When the thickness of the AlTa buffer layer is 500 Å, the hillock is generated to a density of about $3 \times 10^9/m^2$. When the thickness of the AlTa buffer layer is equal to or greater than about 1000 Å, no hillock is generated.

Figure 10:
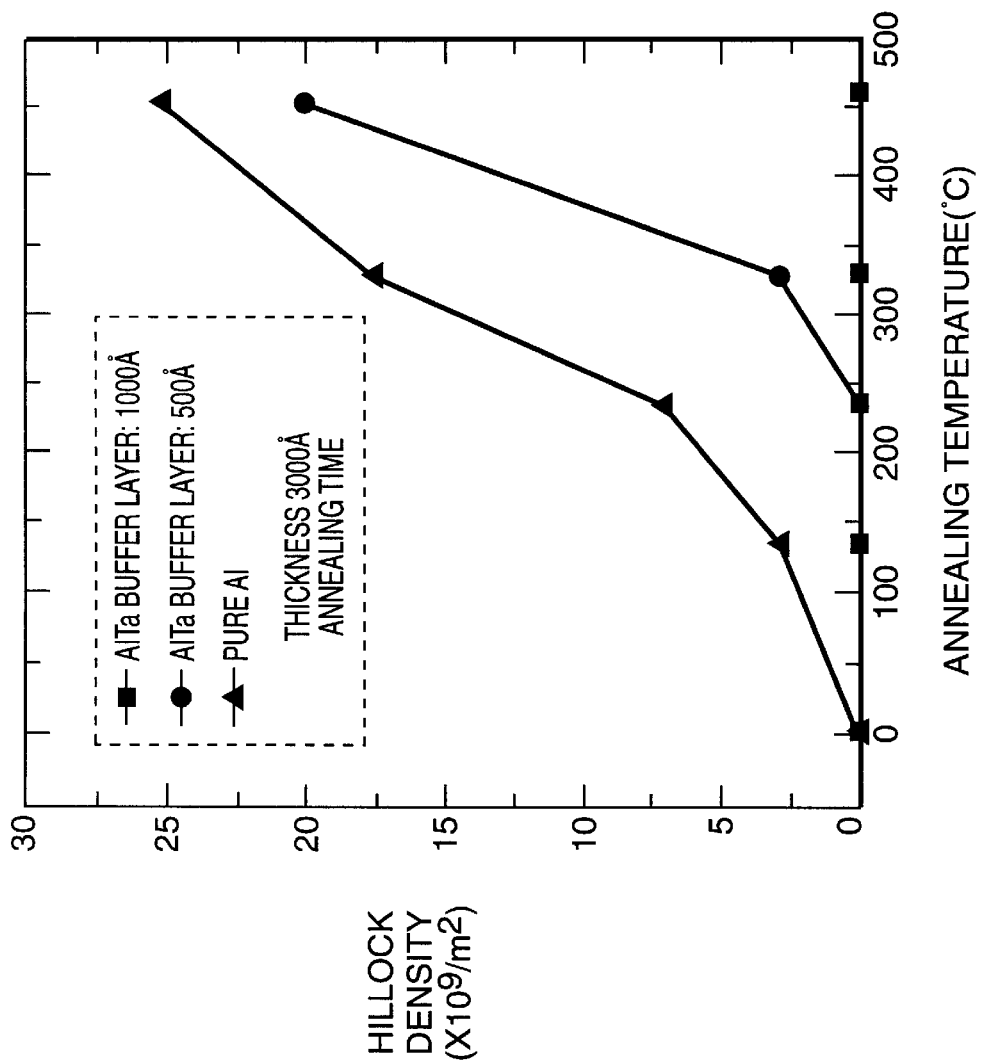
FIG. 10 is a graph showing the density variation of the hillock formation versus the annealing temperature.

FIG. 10 is a graph showing the density variation of the hillock versus the annealing temperature. The thickness of the Al on the AlTa buffer layer is about 3000 Å. The annealing is performed for about 30 minutes. In the case where there is no AlTa buffer layer, but only a pure aluminum, when the annealing temperature is about 130° C., the hillock was generated to a density of about $3 \times 10^9/m^2$. When the annealing temperature is increased to about 240° C., the density of the hillock increases to about $7 \times 10^9/m^2$. When the annealing temperature is further increased to about 300° C., the density of the hillock increases to about $15 \times 10^9/m^2$. When the annealing temperature is yet further increased to about 450° C., the density of the hillock increases to about $25 \times 10^9/m2$.

In the case where the AlTa buffer layer having a thickness of 500 Å is used, when the annealing temperature is about 300® C., the hillock is generated to a density of about $3\times10^9/m^2$. When the annealing temperature is increased to about 450° C., the density of the hillock increases to about $20\times10^9/m^2$.

Further, in the case where the thickness of the AlTa buffer layer is increased to 1000 Å, no hillock is generated.

Figure 11:
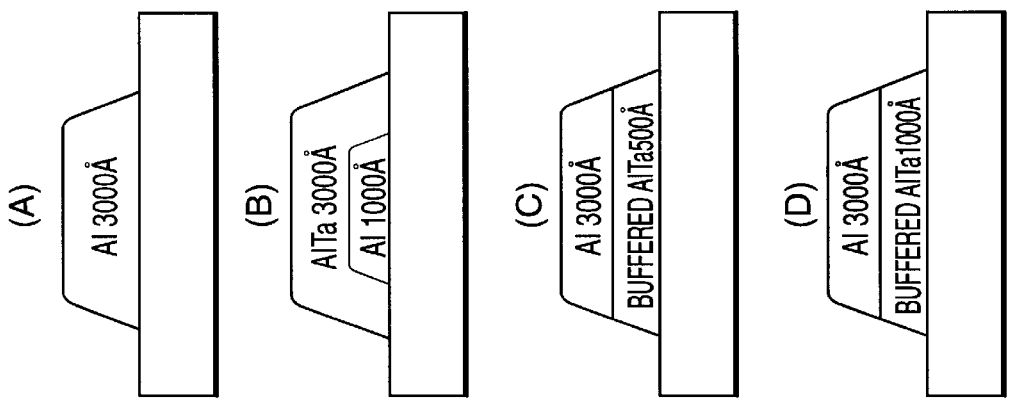
FIG. 11 is a graph showing the size variation of the hillock versus the gate metal structure.
Figure 11:
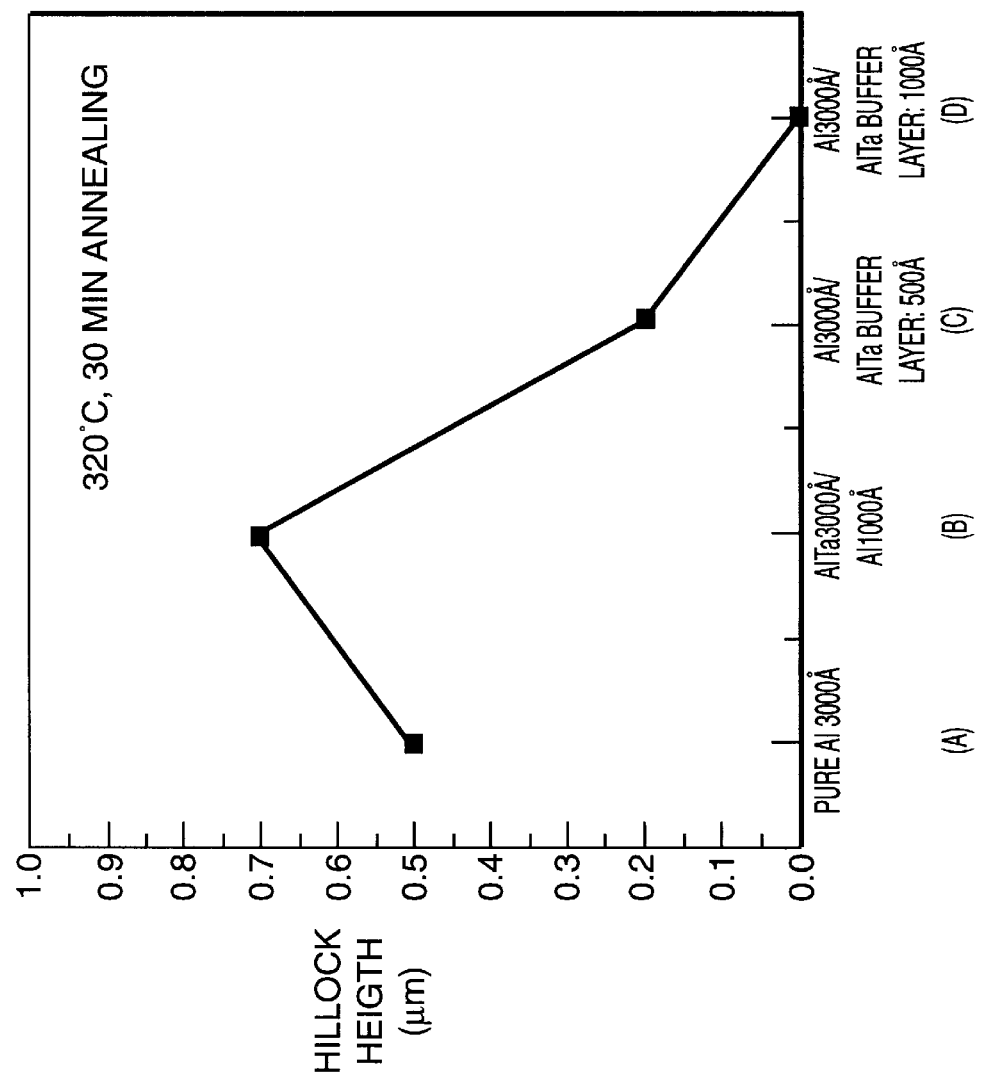

FIG. 11 is a graph showing the size variation of the hillock with respect to various structures of the gate metal. The condition is that the annealing is performed for 30 minutes at a temperature of about 320° C. In case (A) where a pure aluminum having a thickness of about 3000 Å is formed directly on the substrate, the height of the hillock is about 0.5 µm. That is, there is a large number of hillocks, but the size of each hillock is relatively small.

In case (B) where the Al film with a thickness of about 1000 Å is formed on the substrate and the AlTa having a thickness of about 3000 Å is formed over the Al, the height of the hillock is about 0.7 µm. That is, the number of hillocks is decreased. However, since the amount of pressure applied to the Al film by the AlTa buffer layer varies over the surface of the Al film, the size of the hillock increases in the where the amount of the pressure is relatively weak.

In case (C) where the AlTa buffer layer having a thickness of about 500 Å is formed on the substrate and the Al film having a thickness of about 3000 Å is formed on the AlTa buffer layer, the height of the hillock is about 0.2 µm. In case (D) where the AlTa buffer layer having a thickness of about 1000 Å is formed on the substrate and the Al film having a thickness of about 3000 Å is formed on the AlTa buffer layer, no hillock was generated.

Figure 12:
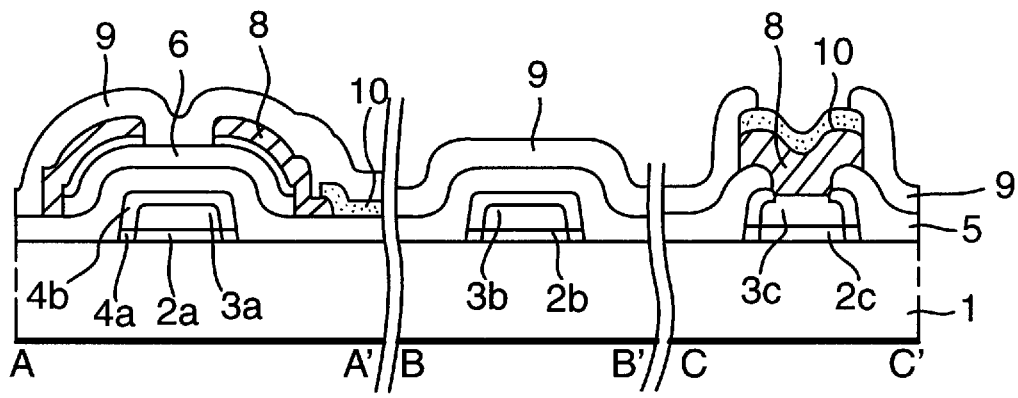
FIG. 12 is a cross-sectional view for illustrating yet another method of manufacturing the liquid crystal display of FIG. 6 according to an embodiment of the present invention, taken along lines A–A', B–B', and C–C'.

FIG. 12 is a cross-sectional view illustrating a method of making the liquid crystal display of FIG. 6 according to an embodiment of the present invention, taken along the lines A–A', A–A', B–B', and C–C'. The process sequence of FIG. 12 is partially same as that of FIG. 8a through FIG. 8d. Referring to FIG. 12, a transparent conductive film is deposited on the entire surface of the resultant structure of FIGS. 8a~8d and patterned photo-lithographically to form a transparent electrode 10 on a portion of drain region 8 on line A–A' and on third metal layer 8 on line C–C'. Then, an insulating film 9 is deposited on the entire surface and patterned photolithographically to form a second insulating film 9 on the entire surface of insulating substrate 1 excluding transparent electrode 10 on third metal layer 8 on line C–C'.

Figure 13:
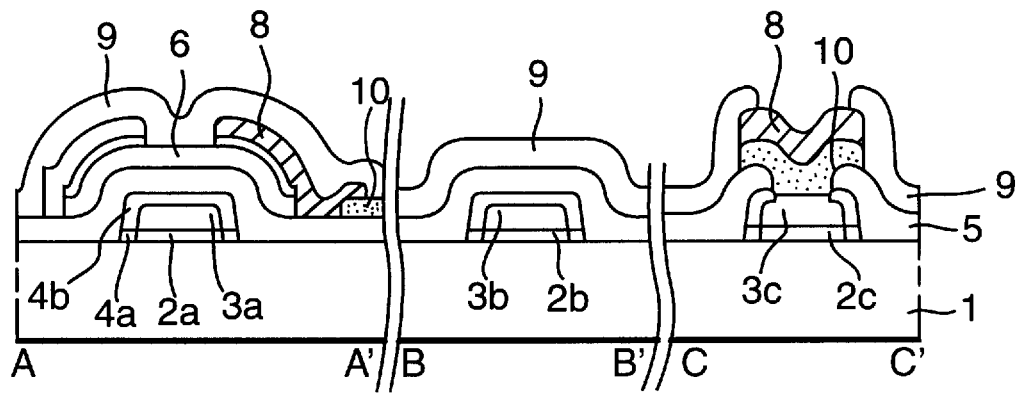
FIG. 13 is a cross-sectional view for illustrating yet another method of manufacturing the liquid crystal display of FIG. 6 according to an embodiment of the present invention, taken along lines A–A', B–B', and C–C'.

FIG. 13 is a cross-sectional view for illustrating yet another method for making the liquid crystal display of FIG. 6 according to an embodiment of the present invention, taken along lines A–A', B–B', and C–C'. The process sequence of FIG. 13 is partially same as that for FIG. 8a~8c. A go semiconductor layer and a doped semiconductor layer are sequentially deposited on the entire surface of the resultant structure of FIGS. 8a~8c, and patterned photolithographically.

Then, a transparent conductive film is deposited on the entire surface and selectively patterned photolithographically to form a transparent electrode 10 on the pixel region of a first insulating film 5 on line A–A' and a second metal layer 3c on line C–C'. Then, a third metal layer is deposited on the entire surface and patterned photolithographically using a mask for the source/drain, to form a third metal layer 8 on a portion of transparent electrode 10 on the line A–A' and transparent electrode 10 on the line C–C'. Then, an insulating film is deposited on the entire surface and patterned photo-lithographically to form a second insulating film 9 on the entire surface of an insulating substrate 1 except for third metal layer 8 on line C–C'.

The present invention provides several unique features. For example, in the structure where the glass substrate, AlTa film and Al film are stacked in that order, the Al diffusion caused by the compressive stress generated due to the difference in the coefficient of thermal expansion between the glass substrate, AlTa film, and Al film is suppressed by Ta. Thus, no hillock is generated.

Further, since the Al film formed on the AlTa film has the same coefficient of thermal expansion (and material characteristics) as that of the AlTa film, the compressive stress is not generated in the interface between the AlTa and Al films during the subsequent high temperature process. Since the compressive stress which exists between the glass substrate and the Al film is relieved by the AlTa buffer layer intermediate the glass and the Al film, no hillock on the Al film is generated. Since no hillock is generated, the occurrence of a step in the metal line in the subsequent process is decreased. Therefore, the shorting of the metal line caused by enchant in the etching process is prevented.

Furthermore, since the defects such as the hillock and the shorting of the metal line are prevented, the yield is improved. Yet further, it is possible to simultaneously etch the AlTa/Al stacked on the substrate. Yet further, since it is not necessary to form a refractory metal layer such as Cr, Mo and the like to prevent the hillock on the open portion of the pad, the process is further simplified. Since the generation of the hillock is prevented, the shorting in the crossing part of the gate line and the data line is prevented.

Other embodiments of the invention will be apparent to those skilled in the art from consideration of the specification and practice of the invention disclosed herein. It is intended that the specification and examples be considered as exemplary only, with a true scope and spirit of the invention being indicated by the followings claims.

What is claimed is:

1. A liquid crystal display apparatus comprising:

a substrate;

a first metal layer over said substrate, said first metal layer including an aluminum alloy having a first metal with a first melting temperature; and a second metal layer over said first metal layer, said second metal layer including a pure aluminum or an aluminum alloy having a second metal with a second melting temperature lower than said first melting temperature.

2. The liquid crystal display of claim 1, wherein said first melting temperature is greater than or equal to 1500° C.

3. The liquid crystal display of claim 1, wherein said second melting temperature is less than 1500° C.

4. The liquid crystal display of claim 1, wherein said first metal includes at least one of refractory metals including tantalum, titanium, molybdenum, tungsten, niobium, zirconium, and vanadium.

5. The liquid crystal display of claim 1, wherein said second metal includes at least one of silicon and copper.

6. The liquid crystal display of claim 1, wherein said aluminum alloy of said first metal layer includes approximately 0.1~2 atomic % of at least one of tantalum, titanium, molybdenum, tungsten, niobium, zirconium, and vanadium.

7. The liquid crystal display of claim 1, wherein said aluminum alloy of the first metal layer includes aluminum-tantalum.

8. The liquid crystal display of claim 1, further comprising:

a first anodizing layer at least partially covering a sidewall of said first metal layer; and a second anodizing layer at least partially covering a sidewall of second metal layer, said sidewall of each of the first and second metal layers having a non-zero angle with respect to the lateral direction of the substrate.

9. A contact pad in a liquid crystal device, comprising:
a substrate,
a first metal layer over said substrate said first metal layer including an aluminum alloy having a first metal with a first melting temperature; and
a second metal layer over said first metal layer, said second metal layer including a pure aluminum or an aluminum alloy having a second metal with a second melting temperature lower than said first melting temperature.

10. The contact pad of claim 9, wherein said first melting temperature is greater than or equal to 1500° C.

11. The contact pad of claim 9, wherein said second melting temperature is less than 1500° C.

12. The contact pad of claim 9, wherein said first metal includes at least one of refractory metals including tantalum, titanium, molybdenum, tungsten, niobium, zirconium, and vanadium.

13. The contact pad of claim 9, wherein said second metal includes at last one of silicon and copper.

14. The contact pad of claim 9, wherein said aluminum alloy of said first metal layer includes approximately 0.1~2 atomic % of at least one of tantalum, titanium, molybdenum, tungsten, niobium, zirconium, and vanadium.

15. The contact pad of claim 9, wherein said aluminum alloy of the first metal layer includes aluminum-tantalum.

16. The contact pad of claim 9, further comprising:
a first anodizing layer at least partially covering a sidewall of said first metal layer; and
a second anodizing layer at least partially covering a sidewall of said second metal layer, said sidewall of each of the first and second metal layers having a non-zero angle with respect to the lateral direction of the substrate.

17. The contact pad of claim 9, further comprising a conductive layer on the second metal layer.

18. The contact pad of claim 17, wherein said conductive layer includes a source or a drain of a switching element.

19. The contact pad of claim 17, wherein said conductive layer includes a transparent electrode.

20. A thin film transistor in a liquid crystal display device, comprising:
a substrate;
a first metal layer over said substrate, said first metal layer including an aluminum alloy having a first metal with a first melting temperature; and
a second metal layer over said first metal layer, said second metal layer including a pure aluminum or an aluminum alloy having a second metal with a second melting temperature lower than said first melting temperature.

21. The thin film transistor according to claim 20, wherein said first melting temperature is greater than or equal to 1500° C.

22. The thin film transistor according to claim 20, wherein said second melting temperature is less than 1500° C.

23. The thin film transistor according to claim 20, wherein said first metal includes at least one of refractory metals including tantalum, titanium, molybdenum, tungsten, niobium, zirconium, and vanadium.

24. The thin film transistor according to claim 20, wherein said second metal at least one of silicon and copper.

25. The thin film transistor according to claim 20, wherein said aluminum alloy of said first metal layer includes approximately 0.1~2 atomic % of at least one of tantalum, titanium, molybdenum, tungsten, niobium, zirconium, and vanadium.

26. The thin film transistor according to claim 20, wherein said aluminum alloy of the first metal layer includes aluminum-tantalum.

27. The thin film transistor of claim 20, further comprising:
a first anodizing layer at least partially covering a sidewall of said first metal layer, said sidewall having a non-zero angle with respect to the lateral direction of the substrate; and
a second anodizing layer at least partially covering said second metal layer.

28. The thin film transistor of claim 27, further comprising;
a first insulating layer over said first and second anodizing layers and said substrate;
a semiconductor layer over said first insulating layer;
a doped semiconductor layer over said semiconductor layer; and
a third metal layer over said doped semiconductor layer and said first insulating layer, said third metal layer having first and second portions separated from one another.

29. The thin film transistor of claim 28, further comprising:
a second insulating layer over said third metal layer, said second insulating layer having a contact hole; and
a transparent electrode over said second insulating layer, said transparent electrode electrically connected to the second portion of the third metal layer through said contact hole.

30. The thin film transistor of claim 28, further comprising a transparent electrode at least partially over said first insulating layer.

31. The thin transistor of claim 28, further comprising a transparent electrode over said second portion of the third metal layer.

32. A method for making a liquid crystal display device, comprising the steps of:
forming a first metal layer over a substrate, said first metal layer including an aluminum alloy having a first metal with a first melting temperature; and
forming a second metal layer over said first metal layer, said second metal layer including a pure aluminum or an aluminum alloy having a second metal with a second melting temperature lower than said first melting temperature.

33. The method for making a liquid crystal display device of claim 32, wherein said first melting temperature is greater than or equal to 1500° C.

34. The method for making a liquid crystal display device of claim 32, wherein said second melting temperature is less than 1500° C.

35. The method for making a liquid crystal display device of claim 32, wherein said first metal includes at least one of refractory metals including tantalum, titanium, molybdenum, tungsten, niobium, zirconium, and vanadium.

36. The method for making a liquid crystal display device of claim 32, wherein said second metal includes at least one of including silicon and copper.

37. The method for making a liquid crystal display device of claim 32, wherein said aluminum alloy of said first metal layer includes approximately 0.1~2 atomic % of at least one of tantalum, titanium, molybdenum, tungsten, niobium, zirconium, and vanadium.

38. The method of making a liquid crystal display device of claim 32, wherein said aluminum alloy of the first metal layer includes aluminum-tantalum.

39. The method for making a liquid crystal display device of claim 32, wherein the step of forming a first metal layer and the step of forming a second layer include patterning said first and second metal layers using a common mask.

40. The method for making a liquid crystal display device of claim 32, further comprising the step of substantially simultaneously forming a first anodizing layer over a sidewall of said first metal layer and a second anodizing layer over a sidewall of said second metal layer, said sidewall of each of the first and second metal layers having a non-zero angle with respect to the lateral direction of the substrate.

* * * * *

UNITED STATES PATENT AND TRADEMARK OFFICE
CERTIFICATE OF CORRECTION

PATENT NO. : 5,825,437
DATED : October 20, 1998
INVENTOR(S) : SEO et al.

It is certified that error appears in the above-indentified patent and that said Letters Patent is hereby corrected as shown below:

Claim 9, column 11, line 7, "substrate," should read
--substrate;--

Claim 9, column 11, line 8, after "substrate", insert --,--.

Claim 24, column 11, line 67, after "metal", insert
--includes--.

Claim 28, column 12, lines 18-19, "comprising;" should read
--comprising:--.

Signed and Sealed this

Twenty-sixth Day of October, 1999

Attest:

Q. TODD DICKINSON

Attesting Officer

Acting Commissioner of Patents and Trademarks